United States Patent
Lien et al.

(10) Patent No.: US 7,135,400 B2
(45) Date of Patent: Nov. 14, 2006

(54) DAMASCENE PROCESS CAPABLE OF AVOIDING VIA RESIST POISONING

(75) Inventors: Wen-Liang Lien, Taipei (TW); Charlie C J Lee, Hsin-Chu Hsien (TW); Chih-Ning Wu, Hsin-Chu (TW); Jain-Hon Chen, Chia-I (TW)

(73) Assignee: United Microelectronics Corp., Hsin-Chu (TW)

( * ) Notice: Subject to any disclaimer, the term of this patent is extended or adjusted under 35 U.S.C. 154(b) by 64 days.

(21) Appl. No.: 10/709,278

(22) Filed: Apr. 26, 2004

(65) Prior Publication Data

US 2005/0239285 A1  Oct. 27, 2005

(51) Int. Cl.
*H01L 21/4763* (2006.01)

(52) U.S. Cl. .............. 438/623; 438/694; 438/625; 438/626; 438/627; 438/629; 438/631; 438/634; 438/636; 438/637; 438/638

(58) Field of Classification Search ........ 438/622, 438/623, 624–627, 629, 634, 636, 637–638
See application file for complete search history.

(56) References Cited

U.S. PATENT DOCUMENTS

| | | | | |
|---|---|---|---|---|
| 6,114,259 A | * | 9/2000 | Sukharev et al. | 438/789 |
| 6,294,457 B1 | * | 9/2001 | Liu | 438/623 |
| 6,642,153 B1 | * | 11/2003 | Chang et al. | 438/725 |

* cited by examiner

*Primary Examiner*—Michael Lebentritt
*Assistant Examiner*—Kyoung Lee
(74) *Attorney, Agent, or Firm*—Winston Hsu

(57) ABSTRACT

A method for avoiding resist poisoning during a damascene process is disclosed. A semiconductor substrate is provided with a low-k dielectric layer ($k \leq 2.9$) thereon, a SiC layer over the low-k dielectric layer, and a blocking layer over the SiC layer. The blocking layer is used to prevent unpolymerized precursors diffused out from the low-k dielectric layer from contacting an overlying resist. A bottom anti-reflection coating (BARC) layer is formed on the blocking layer. A resist layer is formed on the BARC layer, the resist layer having an opening to expose a portion of the BARC layer. A damascene structure is formed in the low-k dielectric layer by etching the BARC layer, the blocking layer, the SiC layer, and the low-k dielectric layer through the opening.

11 Claims, 16 Drawing Sheets

DAMASCENE PROCESS CAPABLE OF AVOIDING VIA RESIST POISONING

BACKGROUND OF INVENTION

1. Field of the Invention

The present invention relates to a process for fabricating a metal interconnect, and more particularly, to a damascene process capable of avoiding via resist poisoning.

2. Description of the Prior Art

At present, metal interconnects of the sub-90 nm integrated circuit manufacturing process are formed by the damascene process and with a 193 nm resist. The damascene process etches a dielectric layer to form a pattern of a metal conductor wire, and then fills the pattern with metal. However, the conventional process needs to dry etch a metal layer and then fill the dielectric layer. Therefore, the damascene process is very important in metal interconnect manufacturing that is unsuitable to dry etch a metal layer, such as Cu. The damascene process could be sub-classified into a single damascene process and a dual damascene process.

Please refer to FIG. 1 to FIG. 3, which show the process schematics according to the single damascene of the prior the art. As shown in FIG. 1 to FIG. 3, the single damascene of the prior art could be classified into the following three main stages after finishing the conductor plug of the pre-layer (not shown). In the first-stage, as shown in FIG. 1, a base layer 10, such as SiN, is deposited. Next, a low-k dielectric layer 12 is deposited over the base layer 10 followed by a SiC layer 14 being deposited over the low-k dielectric layer 12. In the second-stage, as shown in FIG. 2, a bottom anti-reflection coating (BARC) layer 16 is formed over the SiC layer 14, a resist layer 18 having a opening 19 to exposure a portion of the BARC layer 16 is formed over the BARC layer 16. In the third-stage, as shown in FIG. 3, a single damascene structure 12 is formed in the low-k dielectric layer 12 by etching through the BARC layer 16 and the SiC layer 14 and etching the low-k dielectric layer 12. Then, a metal layer is deposited (not shown). A CMP process removes the metal residues over the low-k dielectric layer 12.

Please refer to FIG. 4 to FIG. 10, which show the process schematics according to the dual damascene of the prior art. As shown in FIG. 4 to FIG. 10, the dual damascene of the prior art could be classified into the following seven main stages after finishing the conductor wire of the pre-layer (not shown). In the first-stage, as shown in FIG. 4, a base layer 20, such as SiN, is deposited. A low-k dielectric layer 22 is deposited over the base layer 20. A SiC layer 24 is deposited over the low-k dielectric layer 22. A metal layer 26 is deposited over the SiC layer 24 to be a hard mask. A first BARC layer 28 is deposited over the metal layer 26. A dielectric layer (not shown) could be set between the metal layer 26 and the first BARC layer 28. A first resist layer 32 is formed having a trench opening 30, called a trench photo. In the second-stage, as shown in FIG. 5, a trench structure 34 is formed by etching through first BARC layer 28, the metal layer 26, and a portion of the SiC layer 24 through the trench opening 30. In the third-stage, as shown in FIG. 6, the first resist layer 32 and the first BARC layer 28 are removed.

In the fourth-stage, as shown in FIG. 7, a second BARC layer 36 is deposited over the SiC layer 24 and the metal layer 26, the second BARC layer 36 filling the trench structure 34. Next, a second resist layer 40 is formed having a via opening 38, called as via photo. In the fifth-stage, as shown in FIG. 8, a via structure 42 is formed by etching through the second BARC layer 36, the SiC layer 24, and a portion of the low-k dielectric layer 22 through the via opening 38.

In the sixth-stage, as shown in FIG. 9, the second resist layer 40 and the second BARC layer 36 are removed. In the seventh-stage, as shown in FIG. 10, a dual damascene structure having the trench and the via structure is formed in the low-k dielectric layer 22 by using the metal layer 26 and the SiC layer 24 as masks. Then, a metal layer (not shown) is deposited over the low-k dielectric layer 22. A CMP process removes the metal residues on the low-k dielectric layer 22.

However, a serious problem in the damascene process of the prior art is a via resist poisoning phenomenon. The above low-k dielectric layers 12, 22 of the damascene process of the prior art contain unpolymerized precursors. The unpolymerized precursors diffuse out from the low-k dielectric layers 12, 22, and the thickness of the SiC layers 14, 24 is insufficient to prevent unpolymerized precursors diffused out from the low-k dielectric layers 12, 22 from contacting an overlying resist. The unpolymerized precursors react with the subsequent resist layers 18, 22 to form a resist scum defect or via missing defect.

SUMMARY OF INVENTION

It is therefore a primary object of the claimed invention to provide a damascene process capable of avoiding via resist poisoning.

According to the claimed invention, a semiconductor substrate with a low-k dielectric layer ($k \leq 2.9$) thereon and a SiC layer over the low-k dielectric layer is provided. A blocking layer is formed on the SiC layer, where the blocking layer is used to prevent unpolymerized precursors diffused out from the low-k dielectric layer from contacting an overlying resist. A BARC layer is formed on the blocking layer. A resist layer having an opening to expose a portion of the BARC layer is formed on the BARC layer. A damascene structure is formed in the low-k dielectric layer by etching through the BARC layer, the blocking layer, the SiC layer, and a portion of the low-k dielectric layer through the opening.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
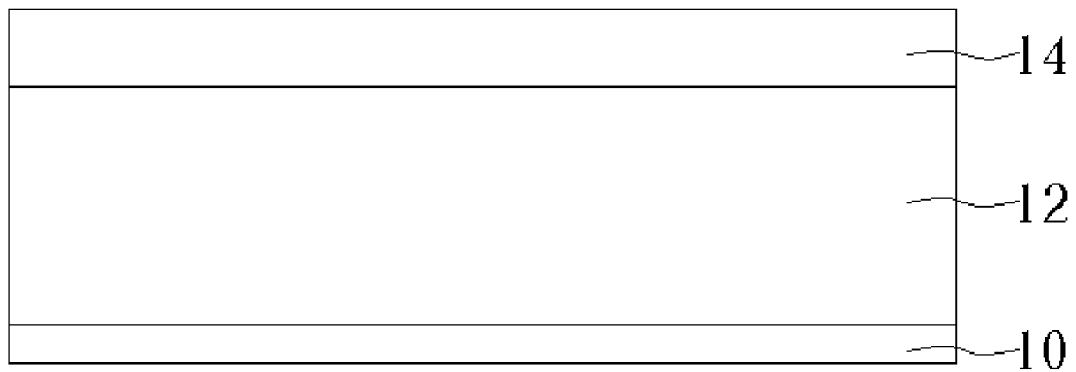
FIG. 1 to FIG. 3 show the process schematics according to the single damascene of the prior art.
Figure 2:
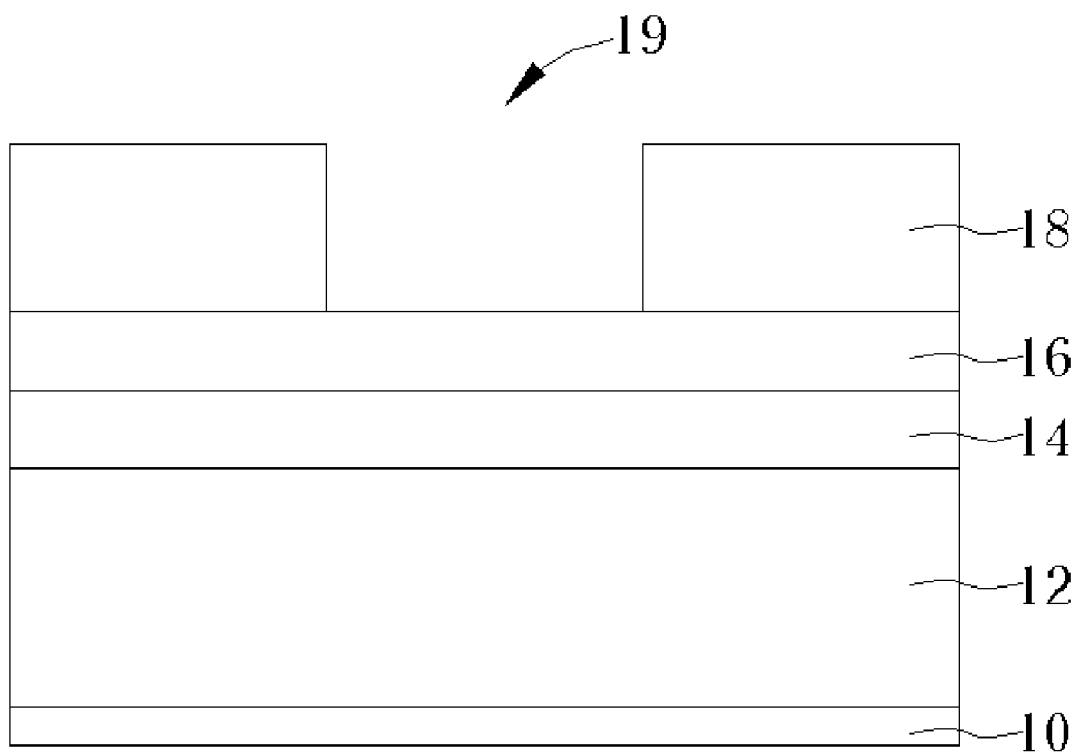
Figure 3:
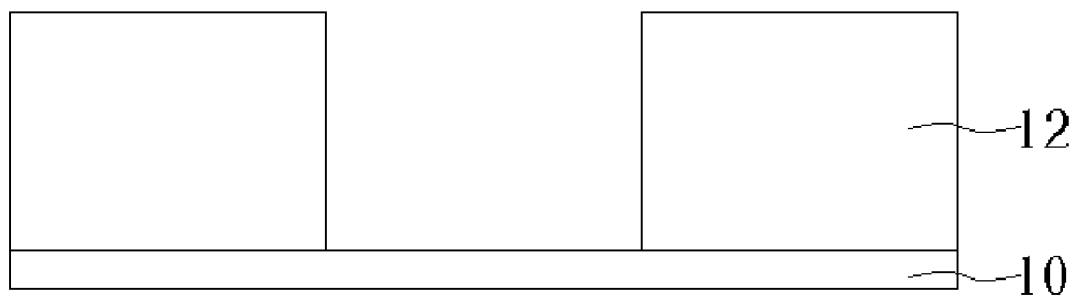
Figure 4:
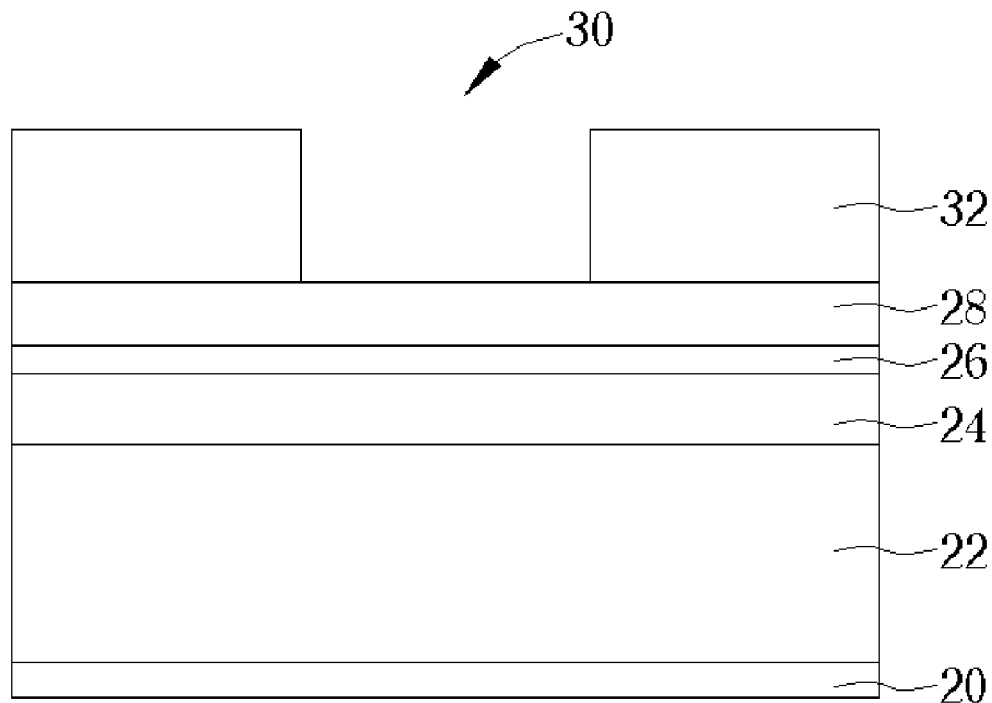
FIG. 4 to FIG. 10 show the process schematics according to the dual damascene of the prior art.
Figure 5:
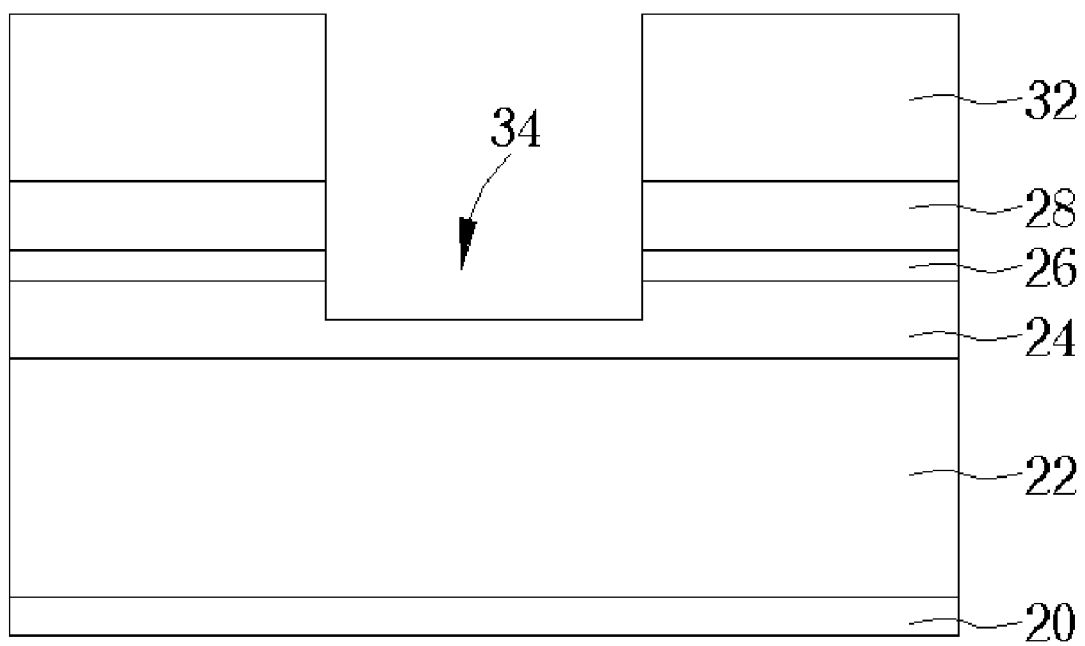
Figure 6:
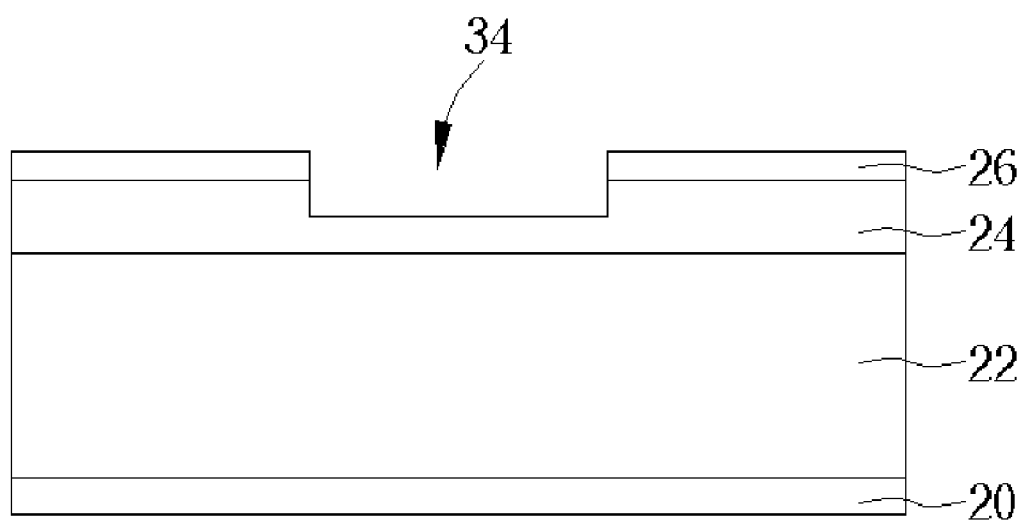
Figure 7:
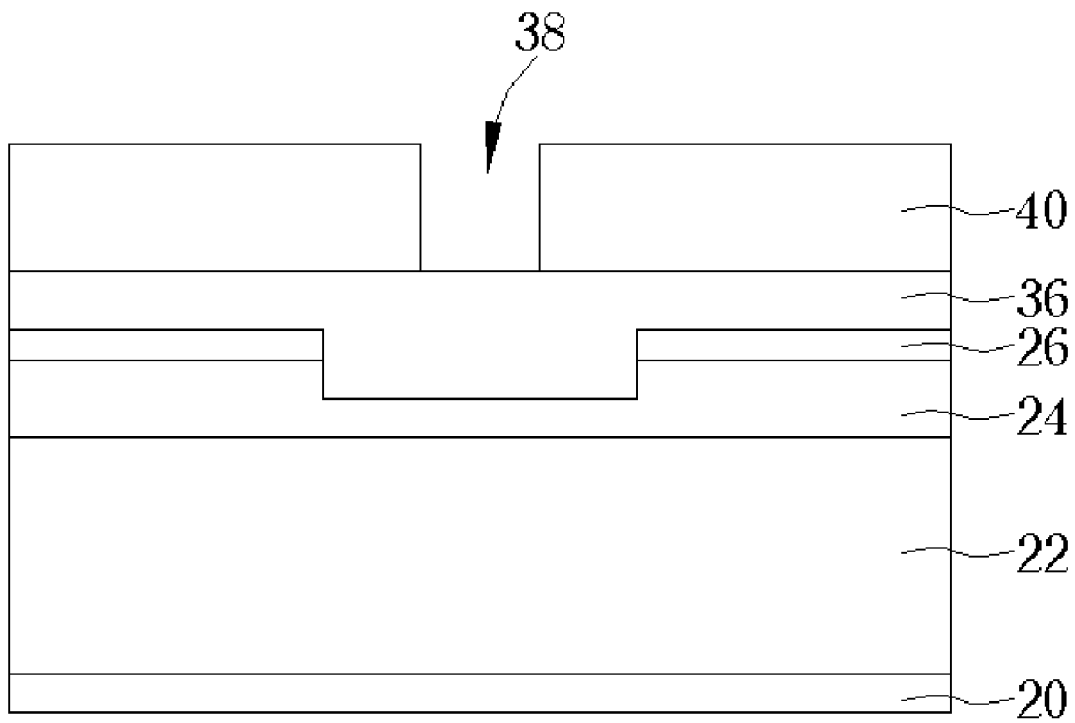
Figure 8:
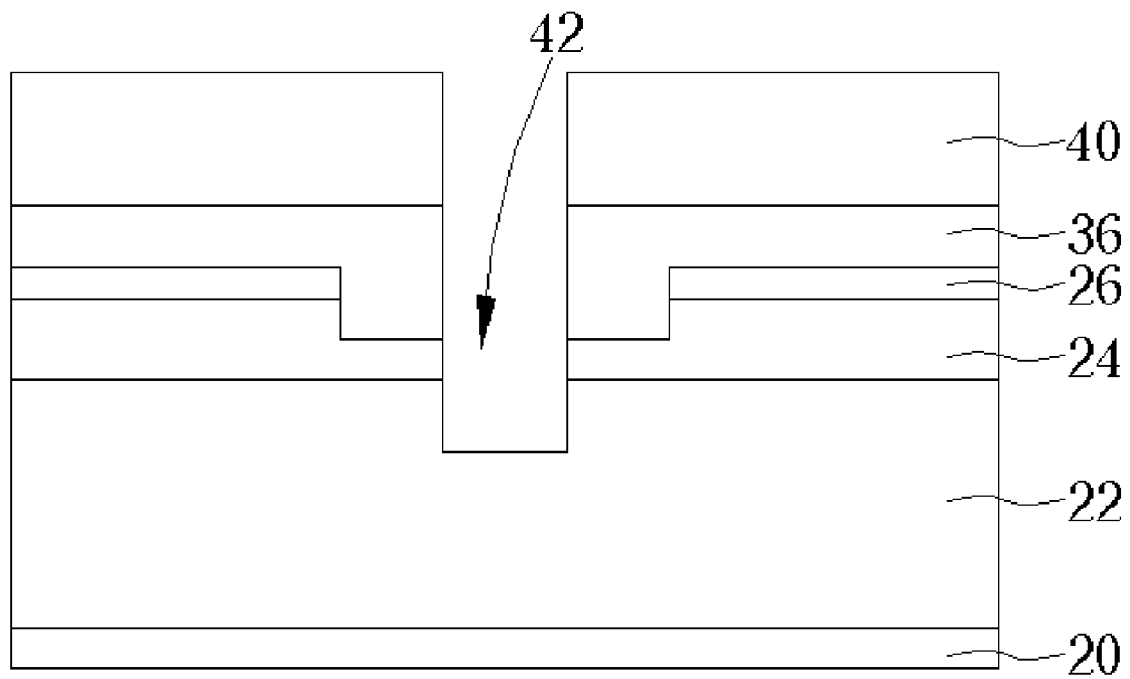
Figure 9:
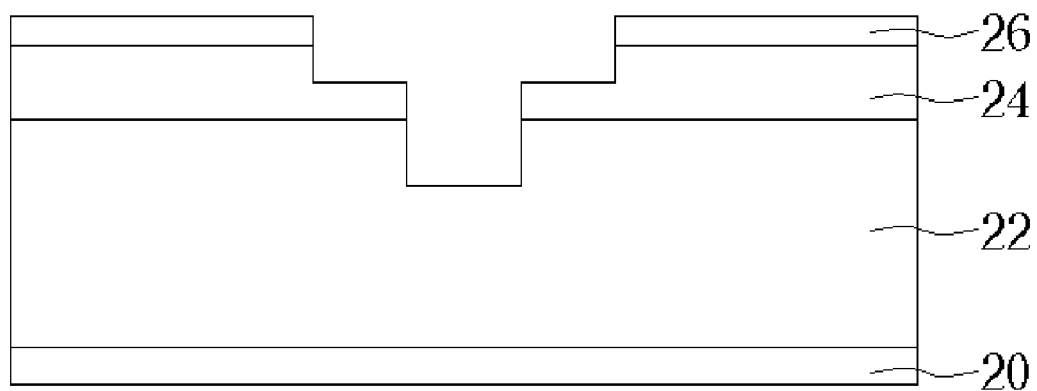
Figure 10:
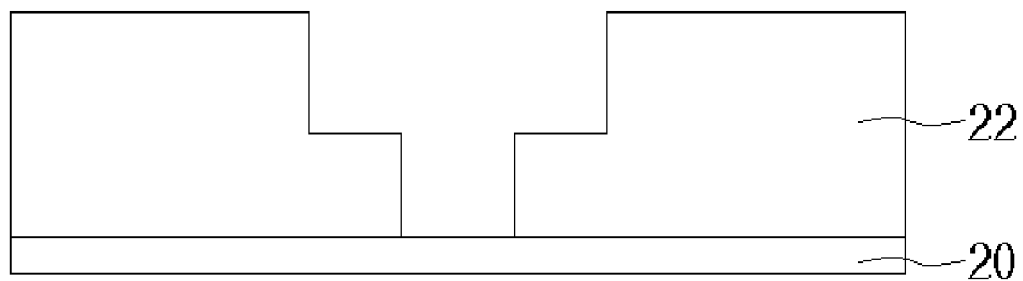
Figure 11:
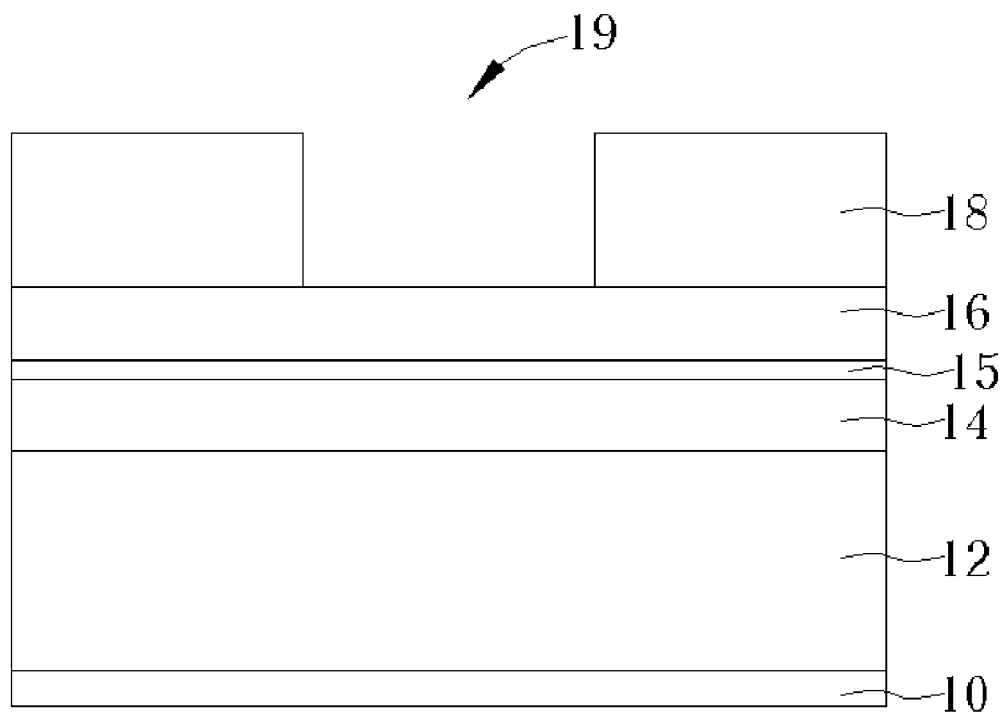
FIG. 11 and FIG. 12 show the process schematics according to the first embodiment of the present invention.
Figure 12:
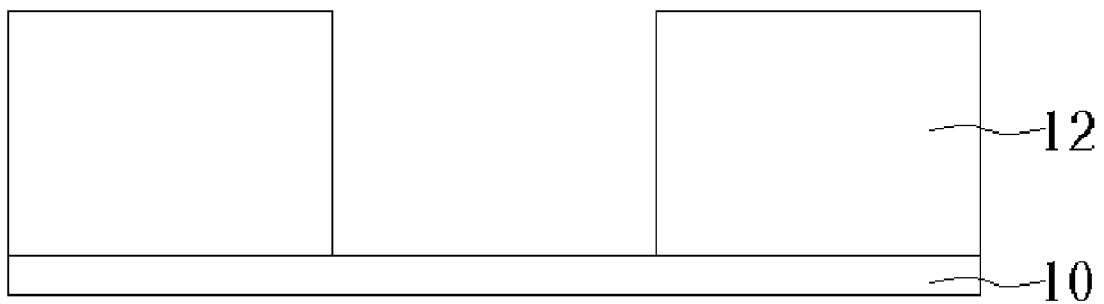

Please refer to FIG. 11 and FIG. 12, which show the process schematics according to the first embodiment of the present invention. The first embodiment of the present invention includes three main stages as previously described in the single damascene process of the prior art section of this application. Since the first-stage of the first embodiment of the present invention is substantially the same as the prior art, further elaboration is omitted here for the sake of simplicity. The discussion of the first embodiment will now begin on the second-stage. In the second-stage, as shown in FIG. 11, a blocking layer 15 on the surface of the SiC layer 14 is formed by Ar plasma hitting the SiC layer 14. The blocking layer 15 is used to prevent unpolymerized precursors diffused out from the low-dielectric layer ($k \leq 2.9$) 12 from contacting a subsequent overlying resist (not shown).

The above low-k dielectric layer 12 comprises a carbon-doped oxide (CDO) substance. The thickness of the SiC layer 14 is less than 700 angstroms. The Ar plasma comprises a fluorine substance. The fluorine substance could be $CF_4$. However, the present invention is not limited in this way.

Next, a BARC layer 16 is formed on the blocking layer 15. A resist layer 18 having a via opening 19 to expose a portion of the BARC layer 16 is formed on the BARC layer 16.

In the third-stage, as shown in FIG. 12, a single damascene structure is formed in the low-k dielectric layer 12 by etching through the BARC layer 16, the blocking layer 15, the SiC layer 14, and a portion of the low-k dielectric layer 12. Then, a metal layer (not shown) is deposited over the low-k dielectric layer 12. A CMP process removes the metal residues on the low-k dielectric layer 12.

Figure 13:
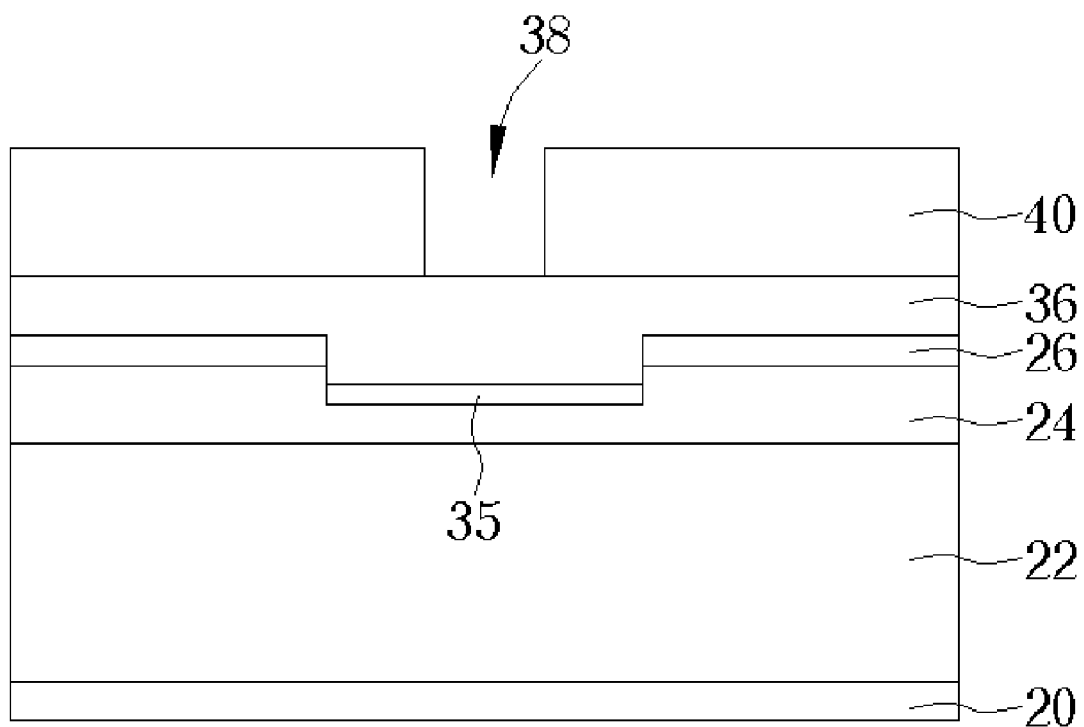
FIG. 13 to FIG. 16 show the process schematics according to the second embodiment of the present invention.

Please refer to FIG. 13 to FIG. 16, which show the process schematics according to the second embodiment of the present invention. The second embodiment of the present invention includes the seven main stages shown in FIG. 4 to FIG. 10 as previously described in the dual damascene process of the prior art section of this application. Since the second embodiment of the present invention from the first-stage to the third-stage is substantially the same as the prior art, further elaboration here is omitted for the sake of simplicity. The discussion of the first embodiment will now begin on the fourth-stage. In the fourth-stage, as shown in FIG. 13, a blocking layer 35 on the surface of the trench structure 34 of the SiC layer 24 is formed by Ar plasma hitting the SiC layer 24, where the blocking layer 35 is used to prevent unpolymerized precursors diffused out from the low-k dielectric layer 22 from contacting an overlying resist.

The above low-k dielectric layer 22 comprises a CDO substance. The thickness of the SiC layer 24 is less than 700 angstroms. The Ar plasma comprises a fluorine substance. The fluorine substance could be $CF_4$. However, the present invention is not limited in this way.

Figure 14:
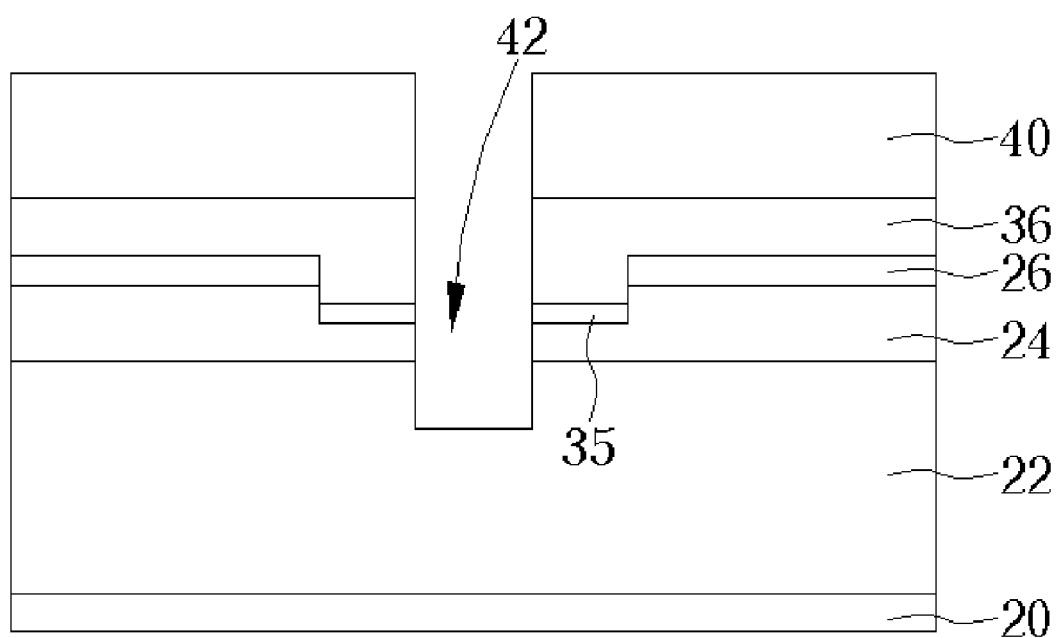

A second BARC layer 36 is formed on the blocking layer 35 and the metal layer 26, the second BARC layer 36 filling the trench structure 34. A second resist layer 40 having a via opening, called a via photo, to expose a portion of the second BARC layer 36 is formed on the second BARC layer 36. In the fifth-stage, as shown in FIG. 14, the via opening 38 is utilized to etch through the second BARC layer 36, the blocking layer 35, the SiC layer 24, and a portion of the low-k dielectric layer 22 to form a via structure 42.

Figure 15:
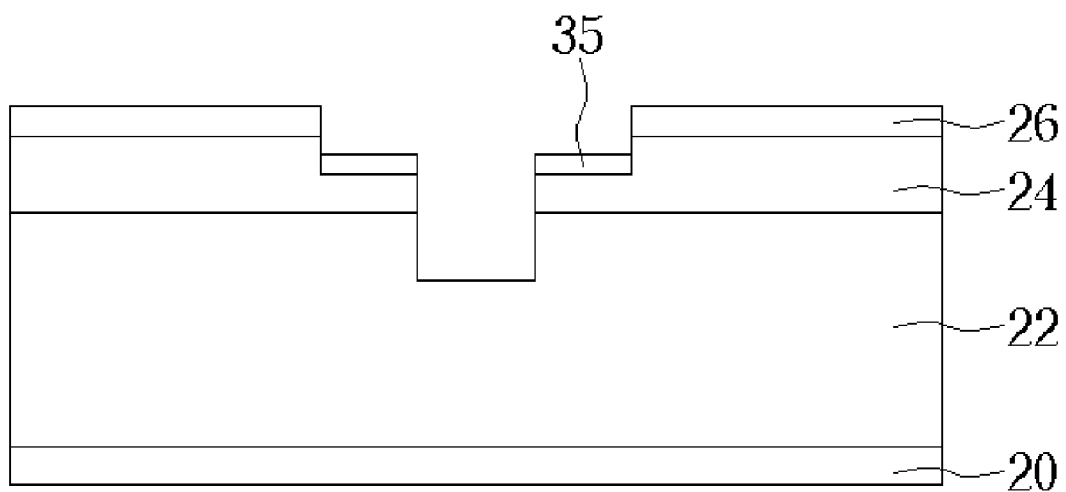
Figure 16:
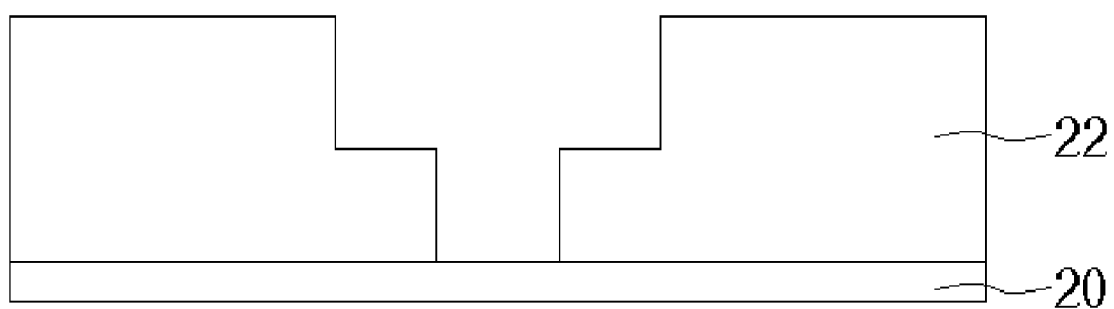

In the sixth-stage, as shown in FIG. 15, the second resist layer 40 and the second BARC layer 36 are removed. In the seventh-stage, as shown in FIG. 16, a dual damascene structure having the trench and the via structure is formed in the low-k dielectric layer 22 by using the metal layer 26 and the SiC layer 24 as masks. A metal layer is deposited (not shown). A CMP process removes the metal residues on the low-k dielectric layer 22.

Those skilled in the art will readily observe that numerous modification and alterations of the process may be made while retaining the teachings of the invention. Accordingly, the above disclosure should be construed as limited only by the metes and bounds of the appended claims.

What is claimed is:

1. A damascene process capable of avoiding via resist poisoning, the damascene process comprising:

providing a semiconductor substrate with a low-k dielectric layer ($k \leq 2.9$) thereon, a SiC layer over the low-k dielectric layer, a metal layer over the SiC layer, and a first bottom anti-reflection coating (BARC) layer over the metal layer;

forming a first resist layer on the first BARC layer, wherein the first resist layer has a trench opening to expose a portion of the first BARC layer;

etching through the first BARC layer and the metal layer and etching a portion of the SiC layer to form a trench structure in the SiC layer;

removing the first resist layer and the first BARC layer;

forming a blocking layer on the surface of the trench structure of the SiC layer, wherein the blocking layer is used to prevent unpolymerized precursors diffused out from the low-k dielectric layer from contacting an overlying resist;

forming a second BARC layer on the blocking layer, the second BARC layer filling the trench structure;

forming a second resist layer on the second BARC layer, the second resist layer having a via opening to expose a portion of the second BARC layer;

etching through the second BARC layer, the SiC layer, and the blocking layer, and etching a portion of the low-k dielectric layer to form a via structure in the low-k dielectric layer;

removing the second resist layer and the second BARC layer; and performing a dual damascene process using the metal layer and the SiC layer as masks to make the low-k dielectric layer form a dual damascene structure having the trench and the via structure.

2. The process of claim 1 wherein the blacking layer is formed by Ar plasma hitting the SiC layer.

3. The process of claim 2 wherein the Ar plasma comprises a fluorine substance.

4. The process of claim 3 wherein the fluorine substance is $CF_4$.

5. The process of claim 1 wherein the low-k dielectric layer comprises a carbon-doped oxide (CDO) substance.

6. The process of claim 1 wherein a dielectric layer is set between the metal layer and the first BARC layer.

7. The process of claim 1 wherein the thickness of the SiC layer is less than 700 angstroms.

8. A damascene process capable of avoiding via resist poisoning, the damascene process comprising:

providing a semiconductor substrate with a low-k dielectric layer ($k \leq 2.9$) thereon, and a SiC layer over the low-k dielectric layer;

forming a blocking layer on the SiC layer, wherein the blocking layer is formed by Ar plasma comprising fluorine substance hitting the SiC layer and is used to prevent unpolymerized precursors diffused out from the low-k dielectric layer from contacting an overlying resist;

forming a BARC layer on the blocking layer;

forming a resist layer on the BARC layer, wherein the resist layer has a via opening to expose a portion of the BARC layer; and etching through the BARC layer, the blocking layer, and the SiC layer, and etching a portion of the low-k dielectric layer to form a single damascene structure in the low-k dielectric layer.

9. The process of claim 8 wherein the fluorine substance is $CF_4$.

10. The process of claim 8 wherein the low-k dielectric layer comprises a carbon-doped oxide substance.

11. The process of claim 8 wherein the thickness of the SiC layer is less than 700 angstroms.

* * * * *